(12) United States Patent
Wolpert

(10) Patent No.: US 9,728,274 B2
(45) Date of Patent: *Aug. 8, 2017

(54) ERROR CONTROL USING THRESHOLD BASED COMPARISON OF ERROR SIGNATURES

(71) Applicant: International Business Machines Corporation, Armonk, NY (US)

(72) Inventor: David S. Wolpert, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 437 days.

This patent is subject to a terminal disclaimer.

(21) Appl. No.: 14/501,797

(22) Filed: Sep. 30, 2014

(65) Prior Publication Data
US 2015/0318060 A1      Nov. 5, 2015

Related U.S. Application Data

(63) Continuation of application No. 14/265,980, filed on Apr. 30, 2014, now Pat. No. 9,384,857.

(51) Int. Cl.
| G06F 11/00 | (2006.01) |
| G11C 29/38 | (2006.01) |
| G06F 11/07 | (2006.01) |

(52) U.S. Cl.
CPC ............ *G11C 29/38* (2013.01); *G06F 11/008* (2013.01); *G06F 11/073* (2013.01);
(Continued)

(58) Field of Classification Search
USPC ....................................................... 714/47.2
See application file for complete search history.

(56) References Cited

U.S. PATENT DOCUMENTS

| 2010/0083029 A1* | 4/2010 | Erickson ............. G06F 11/0709 714/2 |
| 2011/0307769 A1* | 12/2011 | Ramaraju ........... G06F 11/1064 714/801 |
| 2015/0058664 A1* | 2/2015 | Wu ........................ G06F 11/25 714/6.32 |

OTHER PUBLICATIONS

D. Wolpert, "Error Control Using Trheshold Based Comparison of Error Signatures," Related Application, U.S. Appl. No. 14/265,980, filed Apr. 30, 2014.

(Continued)

*Primary Examiner* — Sarai Butler
(74) *Attorney, Agent, or Firm* — Cantor Colburn LLP; Margaret A. McNamara

(57) ABSTRACT

A technique is provided for system reliability. An input is received, and a computation operation on the input is repeated to generate multiple output values. The multiple output values are stored in a table along with a number of hits for each distinct output value in the multiple output values, and the number of hits indicates a number of times each distinct output value was generated by the repeating. A reliability circuit checks whether the number of hits for any one distinct output value meets a confidence threshold. Based on meeting the confidence threshold for the number of hits, the any one distinct output value is output. Based on the number of hits for the any one distinct output value not meeting the confidence threshold, the computation operation is continuously repeated on the input until the number of hits for the any one distinct output value meets the confidence threshold.

5 Claims, 8 Drawing Sheets

(52) U.S. Cl.
CPC ........ *G06F 11/076* (2013.01); *G06F 11/0754* (2013.01); *G06F 11/0772* (2013.01)

(56) References Cited

OTHER PUBLICATIONS

List of IBM Patents or Patent Applications Treated as Related; Oct. 1, 2014; pp. 1-2.

\* cited by examiner

FIG. 4

| VALUE | #HITS | %TOTAL |
|---|---|---|
| 010 | 4 | 50.0% |
| 001 | 2 | 25.0% |
| 011 | 1 | 12.5% |
| 100 | 1 | 12.5% |

CHECK WHETHER A NUMBER OF HITS FOR ANY ONE OUTPUT VALUE IN THE MULTIPLE OUTPUT VALUES MEETS A CONFIDENCE THRESHOLD 525

BASED ON MEETING THE CONFIDENCE THRESHOLD FOR THE NUMBER OF HITS FOR THE ANY ONE OUTPUT VALUE, OUTPUT THE ANY ONE OUTPUT VALUE 530

BASED ON THE NUMBER OF HITS FOR THE ANY ONE OUTPUT VALUE NOT MEETING THE CONFIDENCE THRESHOLD, CONTINUE TO REPEAT THE COMPUTATION OPERATION ON THE INPUT UNTIL THE NUMBER OF HITS FOR THE ANY ONE OUTPUT VALUE OF THE MULTIPLE VALUES MEETS THE CONFIDENCE THRESHOLD 535

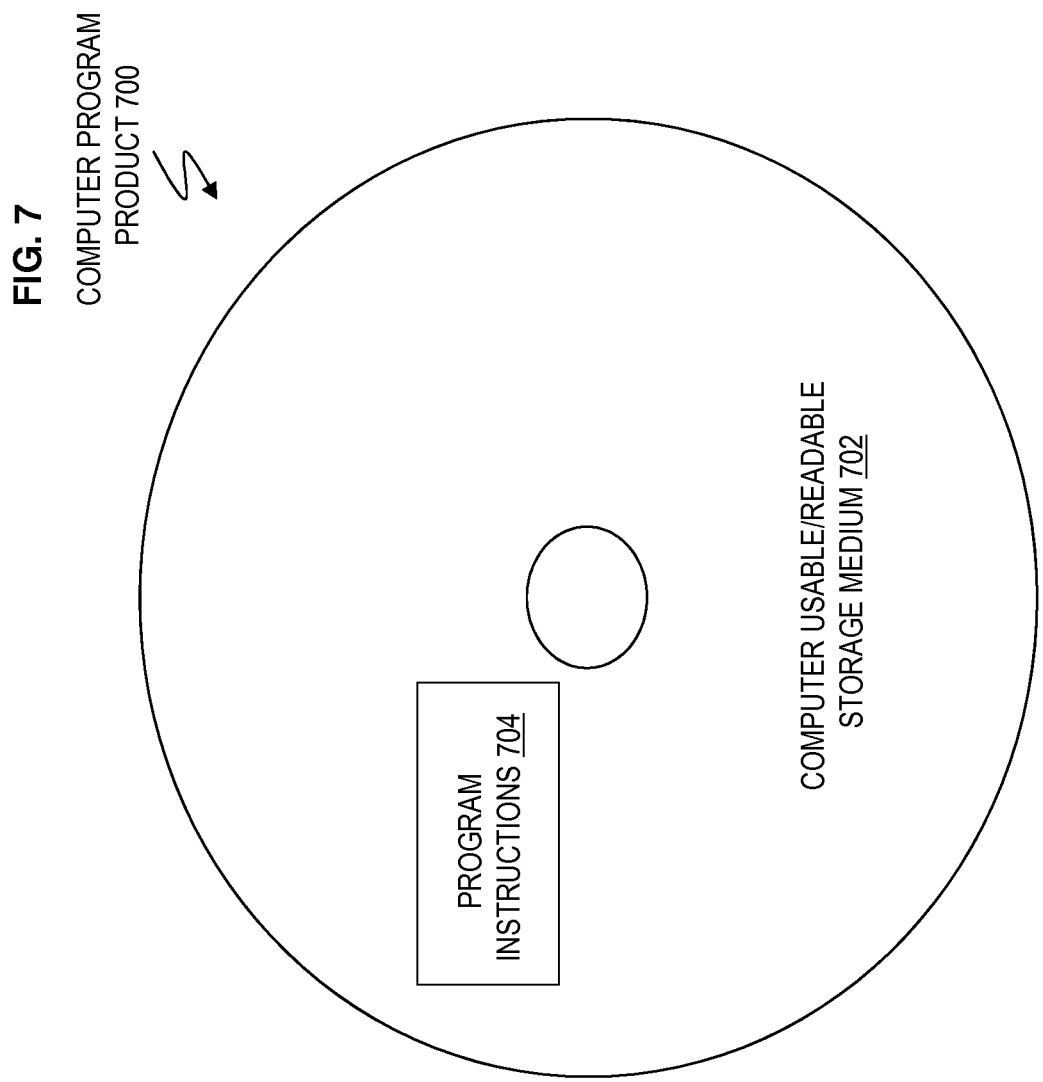

ERROR CONTROL USING THRESHOLD BASED COMPARISON OF ERROR SIGNATURES

This application is a continuation of U.S. application Ser. No. 14/265,980, filed on Apr. 30, 2014, which is herein incorporated by reference in its entirety.

BACKGROUND

The present invention relates generally to system reliability, and more specifically, to reliability circuits using threshold based comparison.

Electrical or magnetic interference inside a computer system can cause a single bit of dynamic random access memory (DRAM) to spontaneously flip to the opposite state. The majority of one-off ("soft") errors in DRAM chips occur as a result of background radiation, chiefly neutrons from cosmic ray secondaries, which may change the contents of one or more memory cells or interfere with the circuitry used to read/write them.

Field programmable gate arrays (FPGAs) are general-purpose logic devices comprising a variety of interconnectable logic resources that are configurable by the end-user to perform a wide variety of functions. Typical FPGAs comprise three types of configurable elements: configurable logic blocks (CLBs), input/output blocks, and interconnects. FPGAs that rely on static latches for their programming elements, also known as SRAM FPGAs, are reconfigurable, meaning they can be reprogrammed with the same or different configuration data. Application specific integrated circuits (ASICs) and Anti-fuse FPGAs cannot be reconfigured.

Manufacturers of systems expected to be exposed to significant levels of radiation, including space-bound systems, favor the lower cost, easier and faster system development, and increased performance of commercial off-the-shelf technology such as SRAM FPGAs. Concerns arise, however, with the ability of technology designed for use on earth to perform reliably in a high-radiation environment. Such reliability is measured in terms of susceptibility to long-term absorption of radiation, referred to as total ionizing dose (TID), and effects caused by the interaction of a single energetic particle, referred to as single event effects (SEE). An SEE occurs when a single particle strikes a sensitive point on a susceptible device and deposits sufficient energy to cause either a hard or soft error. A soft error, or single event upset (SEU) occurs when a transient pulse or bit flip in a device causes an error detectable at the device output. SEUs may alter the logic state of any static memory element (latch, flip-flop, or RAM cell). Since the user-programmed functionality of an SRAM FPGA depends on the data stored in millions of configuration latches within the device, an SEU in the configuration memory array may have adverse effects on the expected functionality.

Techniques used for mitigating, detecting and correcting the effects of SEUs in a circuit depend on the criticality, sensitivity, and nature of the system in question. Known mitigation techniques for use in memory and other data-related devices include parity checking and use of a Hamming, Reed-Solomon (RS), or convolutional code schemes. SEU mitigation in control-related devices is somewhat more difficult because they are, by nature, more vulnerable to SEUs and often more critical to spacecraft operation. Common control-related SEU mitigation techniques include redundant systems, watchdog timers, error detection and correction (EDAC), and current limiting. Unfortunately, many of these techniques for mitigating SEU effects in SRAM FPGAs tend to require substantial configurable logic block (CLB) resources, and can disrupt device and user function.

System redundancy involves multiple identical systems operating in lockstep with synchronized clocking. Errors, which might otherwise not be immediately noticeable, are detected when outputs disagree. Two identical systems in lockstep operation provide minimal protection, and, by way of correction, both systems must be reinitialized when an error is detected. Threefold redundancy is used because, based on the assumption that any two of the three devices will always be error free, only the device whose output disagrees with the other two need be reconfigured. Thus, the system is able to continue functioning on two of the devices during the short interval needed to reconfigure the upset device.

A voting scheme makes threefold redundancy possible: a voting circuit chooses the output agreed upon by a majority of the devices and disregards the remaining device if its output disagrees with that of the majority. Such a triple modular redundancy (TMR) voting scheme has been SEU-tested for systems employing FPGAs, but requires over two-thirds of the FPGAs' gates, or multiple runs through one or more modules with each result stored until the repetition has completed. Unfortunately, the voting circuit, if implemented in SRAM cells, is itself susceptible to SEU effects. Additionally, these systems are susceptible to multiple simultaneous errors, resulting in cases where no vote can be made because the three copies each have different values, or worse, the case where an incorrect vote is made because two copies arrive at the same incorrect value. Furthermore, applying TMR techniques to internal flip-flops alone is insufficient by itself because it may very well be the circuit that precedes the flip-flops that fails, thereby causing all three redundant flip-flops to load the same incorrect value.

Design mitigation techniques, such as triple redundancy, can harden functionality against single event upsets. However, mitigation techniques alone do not correct the erroneous results of SEUs and such errors can accumulate over time. Error detection techniques include reading back the entire configuration data memory and performing a bit-for-bit comparison against data known to be correct. Error correction techniques include complete reconfiguration of the entire configuration data memory using data known to be correct. Both techniques are inefficient, can require additional hardware, can require substantial configurable logic block (CLB) resources, and can disrupt device and user function.

SUMMARY

Embodiments include a system for system reliability. An input is received, and a computation operation on the input is repeated to generate multiple output values. The multiple output values are stored in a table along with a number of hits for each distinct output value in the multiple output values, and the number of hits indicates a number of times each distinct output value was generated by the repeating. A reliability circuit checks whether the number of hits for any one distinct output value meets a confidence threshold. Based on meeting the confidence threshold for the number of hits for the any one distinct output value, the any one distinct output value is output. Based on the number of hits for the any one distinct output value not meeting the confidence threshold, the computation operation is continu-

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIG. 4 depicts a table for recording output values and comparing percentage of total received outputs in accordance with an embodiment;

FIG. 7 depicts a computer-readable medium according to an embodiment.

DETAILED DESCRIPTION

Figure 1:
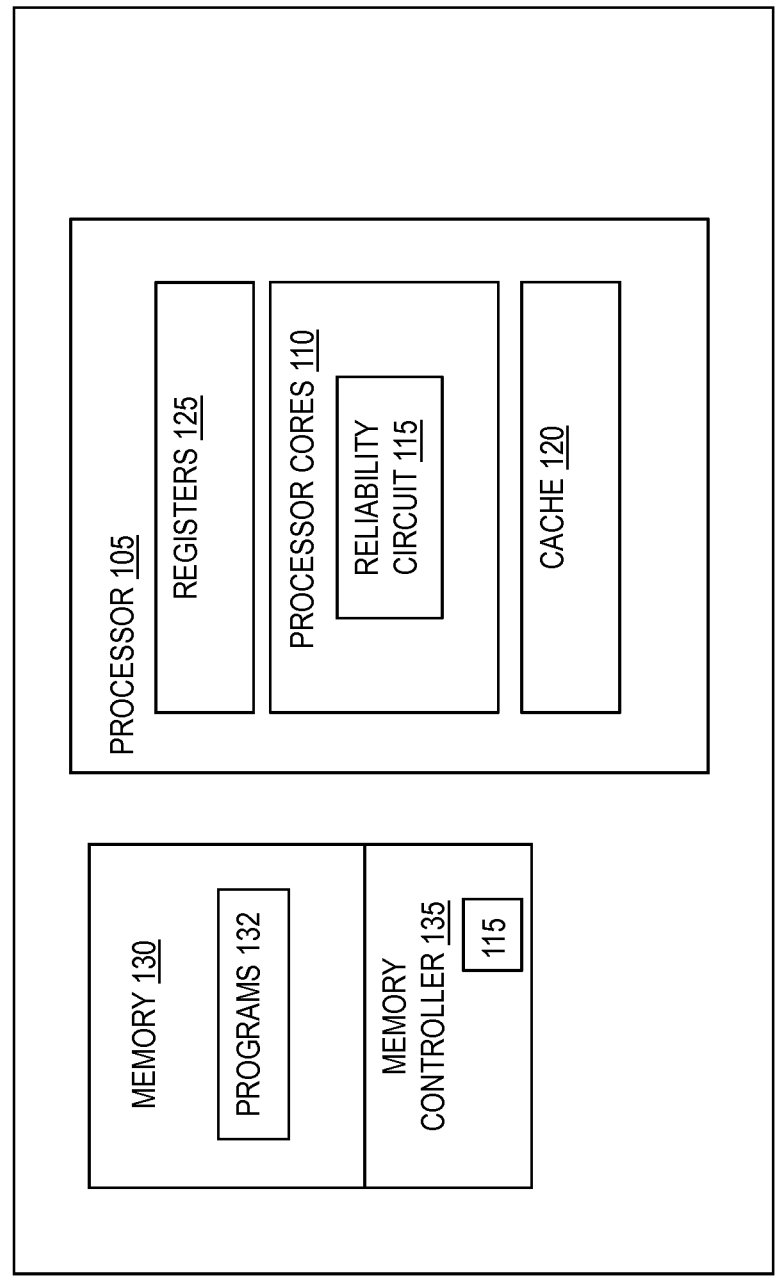
FIG. 1 depicts a schematic block diagram of an example computer system in accordance with an embodiment.

This disclosure provides a solution for monitoring and controlling system reliability, such as using a reliability circuit according to an embodiment. System reliability is becoming an increasingly critical metric as the number of devices on a chip increases and the feature sizes of those devices decrease. To further complicate the problem, supply voltages continue to decrease and this increases noise concerns, particularly at higher clock frequencies and when mixing analog components with digital components. These increased speeds are also achieved by reducing path lengths, which increases latch counts and makes systems more susceptible to particle strikes.

Current solutions (in the state-of-the-art) to the reliability problem are grouped by error mechanism below in Table 1:

TABLE 1

| Solution | Limitation |
| --- | --- |
| Guard bands | Reduce performance |
| | Waste resources for non-critical paths |
| | Do not check data for inconsistencies |
| Variation monitors | Large overheads and complexity |
| | Monitoring quality limited by # sensors |
| | Do not check data for inconsistencies |
| Canary detectors | Large overheads and complexity |
| | Assumptions on noise profiles |
| | Do not check data for inconsistencies |
| Redundant Units | Massive overheads |
| | Useless in high noise environments |
| | (e.g. two errors in a TMR system) |
| Error Control Coding | Large overheads, massive complexity |
| | Only useful for linear or non-varying |
| | systems (e.g. memories, links) |

In Table 1, each of these solutions are limited in the following ways:

(1) Guard bands reduce performance, and waste resources for every path that is not the worst case. These guard bands also do not actually check the data output for inconsistencies.

(2) Variation monitors do not actively check the data output for inconsistencies. The monitors themselves can result in large overheads and complexity, and the quality of the monitoring is limited by the number of sensors placed on the chip. Thus, a complete chip solution with fine granularity requires severe overhead.

(3) Canary detectors do not actively check the data output for inconsistencies, and are only capable of providing a snapshot of a specific region of the chip. Thus, a complete chip solution would have severe overheads.

(4) Redundant units can check the data output for inconsistencies, but result in massive overheads and become useless in high noise environments. For example, if a triple modular redundant (TMR) system produces three different results, the arbiter will guess which solution is correct.

(5) Error control coding (ECC) can check the data output for inconsistencies, but ECC overheads and complexity are only useful for linear or non-varying systems such memories. For larger random logic systems, parity bits cannot easily be mapped from input to output, resulting in huge overheads and complexity.

As can be understood by one skilled in the art, existing state-of-the-art reliability solutions have major limitations. They waste resources, and either do not check the output data for inconsistencies, provide incomplete protection, or are only able to protect specific portions of a chip.

FIG. 1 illustrates a computer system 100 according to an embodiment. The computer system 100 includes a processor 105, and the processor 105 includes one or more processor cores 110. The processor cores 110 include processing circuitry that processes instructions from one or more caches 120, such as an L1 cache, and memory 130. The processor 105 may include registers used for storage during various computations.

The memory 130 may include and/or be operatively connected to a memory controller 135. The memory controller 135 may be a digital circuit which manages the flow of data going to and from the memory 130.

Each processor core 100 may include one or more reliability circuits 115 that monitor and control reliability in the processor cores 110. Also, the memory controller 135 may include one or more reliability circuits 115. The reliability circuit 115 may be placed in and utilized in any system that requires extremely high reliability and/or is subject to extremely low signal-noise ratios, where the area/energy overhead is acceptable. The reliability circuit 115 may be integrated in critical memory systems, critical computational units, low power communication systems, and long-distance (satellite) communication systems.

Figure 2:
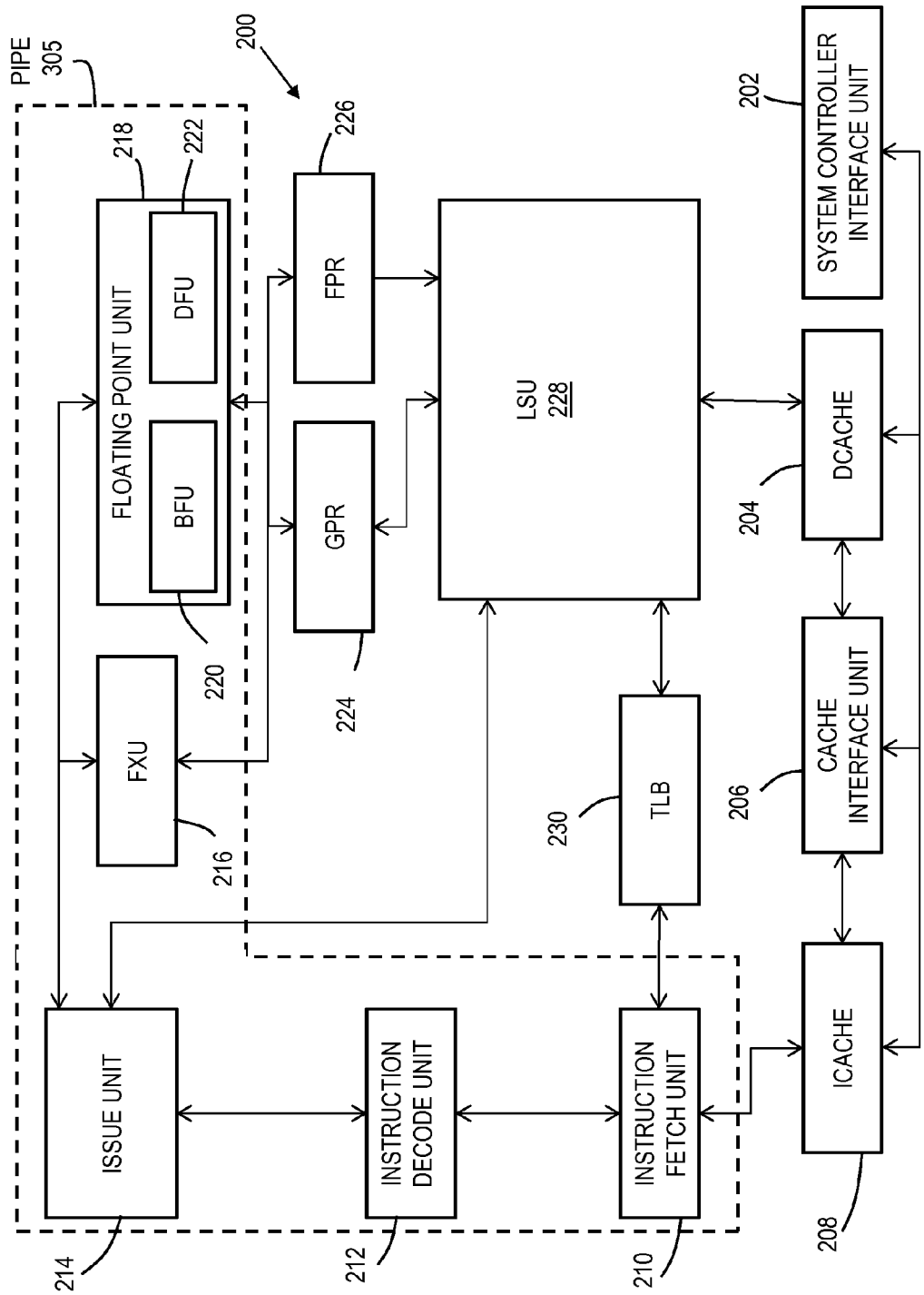
FIG. 2 depicts a schematic block diagram of processing circuitry for a processor core in accordance with an embodiment.

Turning now to FIG. 2, a block diagram of processing circuitry 200 for implementing a processing core, such as one or more of the processor cores 110 in FIG. 1, is generally shown in accordance with an embodiment. The processing circuitry 200 is an example of a processing circuit that can support features disclosed herein. The processing circuitry 200 shown in FIG. 2 includes a system controller interface unit 202 that can couple the processing circuitry 200 to other processors and peripheral devices. The system controller interface unit 202 can also connect a Dcache 204, which reads and stores data values, an Icache 208, which reads program instructions, and a cache interface unit 206 to external memory, processors, and other peripheral devices.

The Icache 208 can provide loading of instruction streams in conjunction with an instruction fetch unit (IFU) 210, which pre-fetches instructions and may include speculative loading and branch prediction capabilities. The fetched instructions can be provided to an instruction decode unit (IDU) 212 for decoding into instruction processing data.

The IDU 212 can provide the instructions to an issue unit 214 which can control the issuing of the instructions to various execution units, such as one or more fixed point units (FXU) 216 for executing general operations and one or more floating point units (FPU) 218 for executing floating point operations. The FPUs 218 can include a binary floating point unit (BFU) 220, a decimal floating point unit (DFU) 222, or any other floating point unit. The issue unit 214 can also be coupled to one or more load/store units (LSU) 228 via one or more LSU pipelines. The multiple LSU pipelines are treated as execution units for performing loads and stores and address generation for branches. Both the LSU 228 and the IFU 210 can utilize a translation-lookaside-buffer (TLB) 230 to provide buffered translations for the operand and instruction addresses.

The FXU 216 and FPU 218 are coupled to various resources such as general-purpose registers (GPR) 224 and floating point registers (FPR) 226. The GPR 224 and FPR 226 provide data value storage for data values loaded and stored from the Dcache 204 by a LSU 228.

Figure 3:
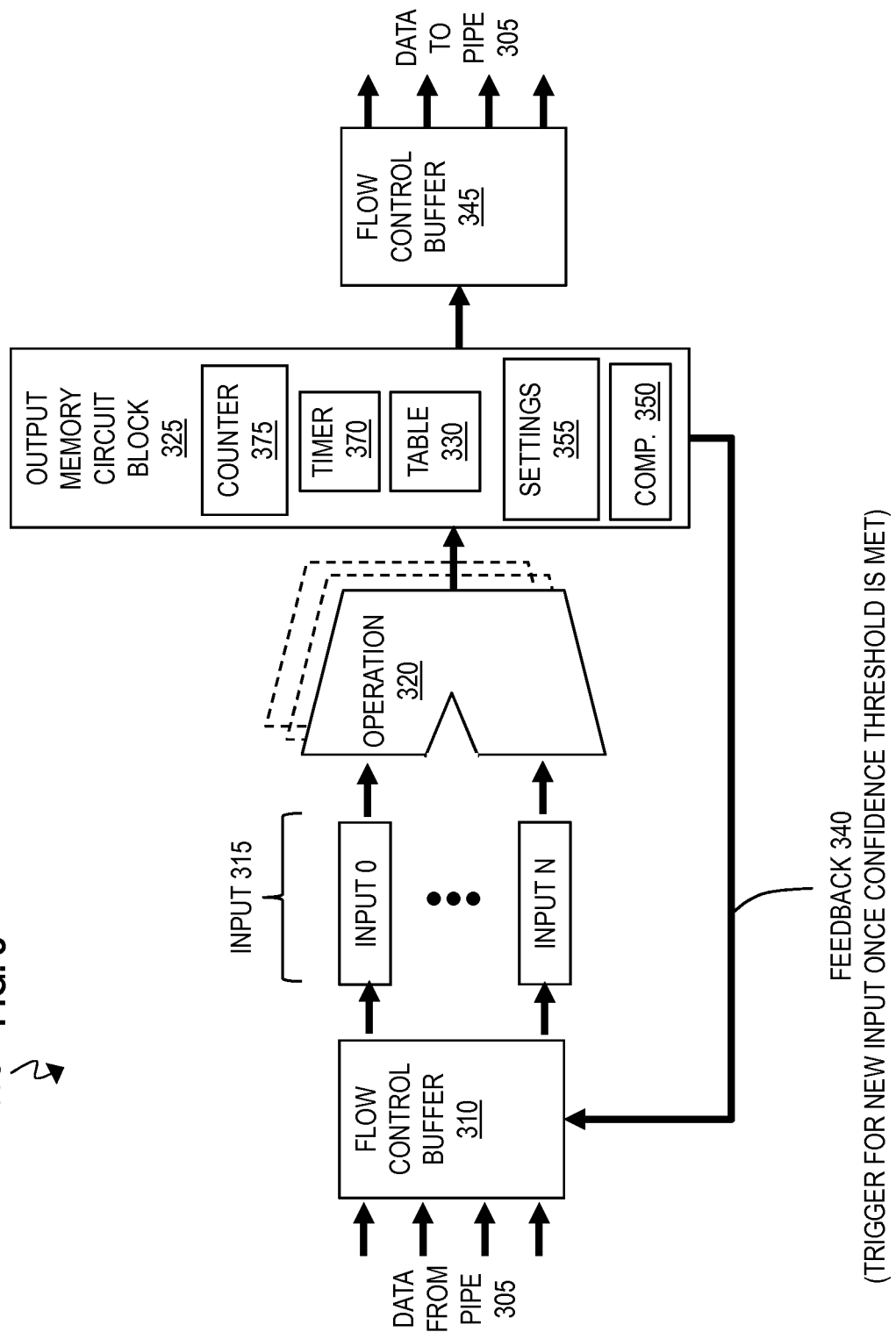
FIG. 3 depicts a schematic block diagram of a monitoring and controlling system reliability circuit in accordance with an embodiment.

FIG. 3 illustrates further details of the monitoring and controlling system reliability circuit 115 according to an embodiment.

The reliability circuit 115 records the multiple output values of a redundant system (through physical replication and/or multiple looped operation) and compares the outputs to a desired accuracy/confidence threshold to determine the correct output value. The reliability circuit 115 waits for a desired minimum number of results (output values), and then continues accumulating additional results (for the same computations) until one result is received a certain percentage of the time. The reliability circuit 115 can be used to protect both linear and non-linear computational elements, and is adaptive to variable noise conditions to optimize performance (e.g., by adjusting the accuracy/confidence threshold). For example, in a low-noise system, the computation operation may be carried out three times with a 66% accuracy/confidence threshold set (this example would be similar to triple modular redundancy (TMR)). If one answer appears ⅔ times and another answer appears ⅓, the ⅔ answer is assumed to be correct by the reliability circuit 115; however, unlike a state-of-the-art TMR system, if three different answers are received the reliability circuit 115 automatically continues accumulating results until one answer has been received at least 66% of the time. In contrast, for a high-noise system, a computation operation may be carried out 10 times with a 30% accuracy/confidence threshold set. In this case, the reliability circuit 115 continues running computations (and accumulating/storing results) until one answer is received 30% of the time; this may correspond to 3 times out of the minimum of 10 operations, but if 5 different answers are received twice each then the reliability circuit 115 continues iterating until one answer arrives 30% of the time.

In one implementation, the monitoring and controlling system reliability circuit 115 may be implemented in a computational circuit, such as the FXU 216 and/or the FPU 218. Also, the reliability circuit 115 may be integrated in a computation circuit and/or be connected to a computation circuit. Assume that data from a pipeline, such as the pipe 305, is input into a flow control buffer 310. Although the pipeline 305 is shown in FIGS. 2 and 3, the flow control buffer 310 may receive data from any pipeline for processing. As understood by one skilled in the art, a pipeline is a set of data processing elements/circuits connected in series, where the output of one element/circuit is the input of the next one.

The flow control buffer 310 is a circuit that is configured to buffer data coming in from the pipeline 305, e.g., passing the first piece of data, while holding the next piece of data. The flow control buffer 310 may pause the flow of data in the pipeline 30 outside of the reliability circuit 115, while execution of the first piece of data occurs in the reliability circuit 115.

The first piece of data is input 315, and the input 315 may be input 0 through input N, wherein N is the last input. In one case, the first piece of data may be two numbers (e.g., input 0 and input N) that need to be added in one or more computation operation circuits 320. The computation operation circuits 320 may be one or more redundant circuits (such as, e.g., 3 separate computation operation circuits 320) that each add the two numbers (in input 0 and input N) in parallel.

Figure 4:
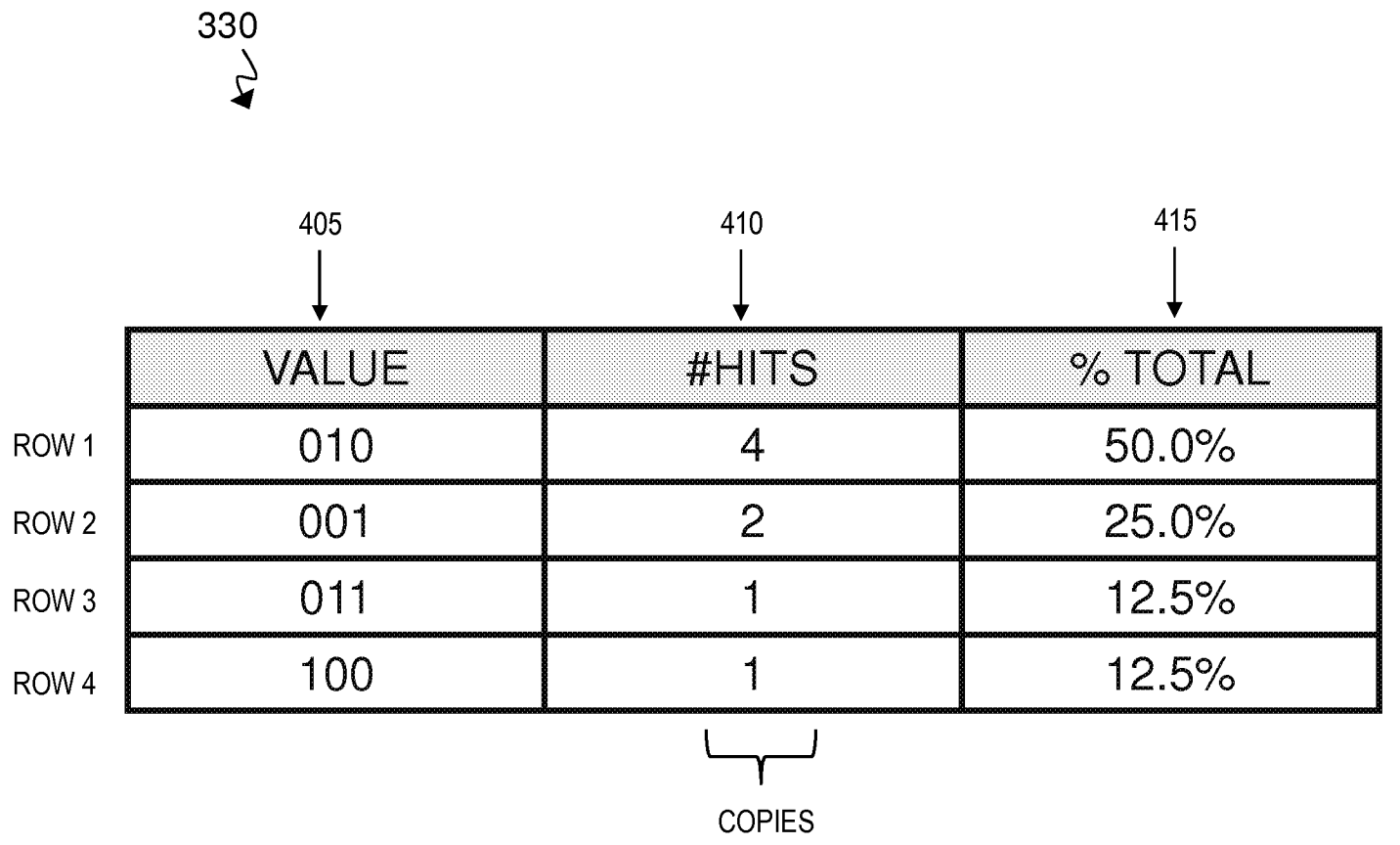

After the computation operation circuit 320, whether one or three, computes the value(s), the output values of the computation operation circuit 320 are input into the output memory circuit block 325. The output memory circuit block 325 may include a content addressable memory (CAM) circuit. The output memory circuit block 325 stores the output values in a table 330. The computation operation circuit 320 continues computing the output values for the same two numbers (i.e., the same inputs 0 and N), and the output memory circuit block 325 continues accumulating and storing the output values into the table 330 until a desired predefined minimum number of calculations (copies) is reached. The predefined minimum number of calculations is the minimum number of copies needed in the table 330 before a comparison circuit 350 performs a comparison, and the minimum number of copies/results required before comparison is saved in settings 355. Each copy of the output value is an individual result calculated by the computation operation circuit 320, where some copies (of the output value) are the same and some copies may be different. As shown in FIG. 4, the table 330 includes an output value column 405, a number (#) of hits column 410, and a percentage (%) of the total copies in the percentage column 415. Table 330 is an example of content addressable memory for recording output values and comparing percentage of total received outputs.

In the example table 330, there are a total of 8 copies, which can be found by adding the values in the number (#) of hits column 410. Having 8 copies (1) means that a single computation operation circuit 320 has been run 8 times (via multiple looped operation) for the same two input numbers in inputs 0 and N, respectively, (2) means that two (or more) computation operation circuits 320 have executed 8 times in parallel (via physical replication) for the same two input numbers in inputs 0 and N, respectively thus equaling 8 copies, and/or (3) means that a mix of physical and looped parallelism were used totaling 8 copies.

Each time the computation is run by the computation operation circuit 320 for the same input 315 (e.g., the same two numbers in inputs 0 and N), the comparison circuit 350 determines if the output value is the same as a previously computed output value that is already stored in value column 405 or is a new output that needs to be added to the table 330. When the output value is the same as the previously computed output value, the comparison circuit 350 recognizes that as a hit in the table 330 and increments the hit number in the hit column 410 for the particular output value. For example, the computation operation circuit 320 in the memory circuit block 325 increments the number of hits in the hit column 410 for the value 010 to 4 hits, and then calculates the percentage (%) of the total copies in the percentage column 415 corresponding to the value 010.

When the output value is new (not the same as any previously computed output value in the value column 405 in the table 330), the comparison circuit 350 inserts the new output value in the value column 405, inserts 1 hit for the new output value number (#) of hits column 410, and calculates a percentage (out of the total copies in the table 330) for percentage column 415 corresponding to this particular new output value.

The settings 355 include the accuracy/confidence threshold that must be met by the calculations of the computation operation circuit 320. The comparison circuit 350 checks whether the predetermined minimum number of copies/results has been calculated. If not, the computation operation circuit 320 continues performing calculations for the same two numbers. When the predetermined minimum number of copies/results is determined to be been stored in the table 330, the comparison circuit 350 then compares each percentage in the percentage column 415 (for each corresponding output value in column 405) to the required percentage of the accuracy/confidence threshold, in order to determine if one (or more) of the percentages in the percentage column 415 matches or exceeds the accuracy/confidence threshold. When one of the output values has a corresponding percentage that matches or exceeds the accuracy/confidence threshold, the (comparison circuit 350) memory circuit block 325 passes the output value having the corresponding percentage meeting or exceeding the accuracy/confidence threshold to a flow control buffer 345. The flow control buffer 345 places the calculated output value on the pipe 305 to be utilized, e.g., by the processor 105. After the accuracy/confidence threshold is met and/or exceeded, the memory circuit block 325 sends a trigger as feedback 340 to the flow control buffer 310. The trigger instructs the flow control buffer 310 to pass the next input (which is the next piece of data such as two or more different numbers). The new input is placed in the input 315 as input 0 through input N, and the new input in input 315 passed to the computation operation circuit 320. The output values (results) of the computation operation circuit 320 are stored in a new table 330 for processing, comparison, etc., as discussed herein for the first piece of data. Note that new table 330 is created and stored for each new piece of data that is processed, in order to accumulate for output values as discussed herein.

For explanation purposes, the accuracy/confidence threshold may be 50%, which means that at least one value in the output value column 405 must have a percentage of at least 50% in the percentage column 415 before the memory circuit block 325 passes the corresponding output value to the flow control buffer 345. Referring to FIG. 4, the memory circuit block 325 determines that the output value '010' in row 1 has a corresponding percentage of 50% that matches the accuracy/confidence threshold. Accordingly, the output value '010' is passed to the pipe 305 as the answer.

In one case, the accuracy/confidence threshold may be 25% and there may be 3 different output values X, Y, and Z each having a corresponding percentage of 25% in their respective percentage column 415. In this case, the memory circuit block 325 is configured send to one or more of the output values X, Y, and Z to pipe 305 (answers) via the flow control buffer 345, depending upon a user definition in the settings 355.

The settings 355, in the memory circuit block 325, may have different accuracy/confidence thresholds for different programs 132 or systems. Assume that various programs 132 send data for computation on the pipe 305, and some programs 132 may have higher accuracy/confidence thresholds in the settings 355. Therefore, in the settings 355, some programs may require a 33% accuracy/confidence threshold, some programs may require a 40% accuracy/confidence threshold, some programs may require a 45% accuracy/confidence threshold, some programs may require a 50% accuracy/confidence threshold, some programs may require a 60% accuracy/confidence threshold, and so forth.

By utilizing the reliability circuit 115 and table 330 as discussed herein, the comparison circuit 350 in memory circuit block 325 is configured to output the correct value from table 330 according to an (adjustable) accuracy/confidence threshold without guessing the correct value using parity.

Unlike state-of-the-art systems, the reliability circuit 115 is used to pick out a specific 'correct' vector (e.g., output value '010') from a field of random noise vectors by applying both spatial and temporal redundancy, by making an intelligent decision based not just on the majority, but on the knowledge that the correct signal may for short periods of time be entirely obscured by noise, and by setting a time/count threshold to account for this possibility of noise. The time and/or count threshold is the predetermined minimum number of copies/results that has been set/stored (in advanced) in the settings 355, in order for the computation operation circuit 320 to know how many times to perform the computation for the same input before performing the first check to see if the accuracy/confidence threshold is met. For example, when the settings 355 has T amount of time set/required for a particular computation being executed by the computation operation circuit 320, a timer 370 increments for 'T' amount of time (e.g., microseconds, seconds, etc.) before the comparison circuit 350 initially checks to see if the accuracy/confidence threshold (e.g., 50%) is met by any output value in the table 330. If not met, the computation operation circuit 320 continues running and the comparison circuit 350 continues checking the table 330 (a predetermined interval of time) until the accuracy/confidence threshold is met.

For example, when the settings 355 have 'C' amount of copies set/required for a particular computation being executed by the computation operation circuit 320, a counter 375 increments for 'C' amount of times (e.g., 15 copies/times) before the comparison circuit 350 initially checks to see if the accuracy/confidence threshold (e.g., 50%) is met by any output value in the table 330. If not met, the computation operation circuit 320 continues running and the comparison circuit 350 continues checking the table 330 (every predetermined amount of copies) until the accuracy/confidence threshold is met.

One state-of-the-art system may use counting of errors, where the error count is used to switch between modes of detection: in periods of low noise the state-of-the-art system uses a simpler form of error control and in periods of higher noise uses a more powerful form of error control. Unlike the state-of-the art, the reliability circuit 115 is not just checking for state changes, but the reliability circuit 115 is configured to sort all changes by value (e.g., in value column 405) and then accumulate the number of times each value is found (e.g., in hit column 410) in order to make a judgment on the 'most likely correct' value (e.g., in percentage column 415).

Figure 5:
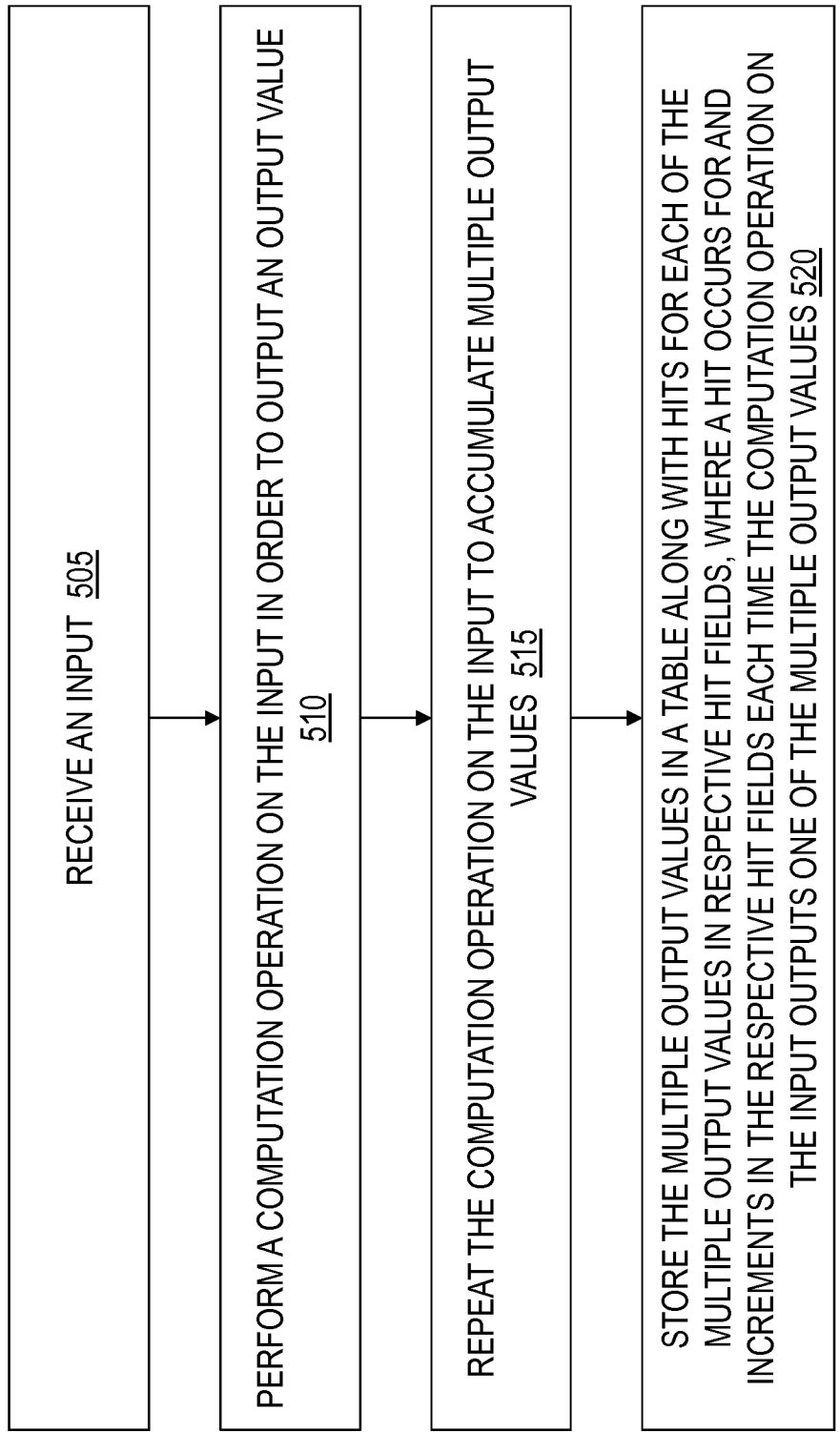
FIGS. 5A and 5B depict a flow diagram for monitoring and controlling system reliability executed by the reliability circuit according to an embodiment.

FIGS. 5A and 5B illustrate a method 500 for monitoring and controlling system reliability executed by the reliability circuit 115 according to an embodiment.

At block 505, the reliability circuit 115 receives an input via the flow control buffer 310 (e.g., from the pipe 205, another circuit/device such as the cache 120, memory 130, registers 125, etc.). Once received, the data of the input 315 is fed to the computation operation circuit 320.

At block 510, the computation operation circuit 320 (of the reliability circuit 115) performs a computation operation on the input 315 in order to output an output value into the memory circuit block 325. The computation operation may be addition, subtraction, division, multiplication, etc.

At block 515, the computation operation circuit 320 repeats the computation operation on the same input 315 (for the same input values/data without moving to the next input values/data) to accumulate multiple output values.

At block 520, the memory circuit block 325 stores the multiple output values in the table 330 along with hits for each of the multiple output values in respective hit fields (in the hit field column 410), such that a hit occurs for and increments in the respective hit fields (in hit field column 410) each time the computation operation on the input outputs one of the multiple output values.

At block 525, the comparison circuit 350 in the memory circuit 325 (reliability circuit 115) checks whether a number of hits (e.g., percentage in the percentage column 415) for any one output value in the multiple output values meets a confidence threshold in the settings 355. At block 530, based on meeting the confidence threshold for the number of hits (e.g., percentage) for the any one output value, the memory circuit 325 outputs the any one output value to the flow control buffer 345 (to place back on the pipe 305).

At block 535, based on the number of hits for any one output value not meeting the confidence threshold, the computation operation circuit 320 continues to repeat the computation operation on the same input (i.e., the same input values/data without moving to the next input values/data) until the number of hits for any one output value of the multiple values meets the confidence threshold.

A minimum number of copies of the multiple output values are generated by repeatedly executing the computation operation. The minimum number of copies required to be generated by the computation operation is set in advance (as a parameter in the settings 355). Each time the computation operation is executed, a copy of the output value is generated. The minimum number of copies of the multiple output values has to be stored in the table 330 before the comparison circuit 350 checks whether the number of hits for the any one output value in the multiple output values meets the confidence threshold.

When the reliability circuit determines that the minimum number of copies has not been stored in the table 330, the computation operation circuit 320 continues executing the same computation operation (for the same input value/data) until the minimum number of copies has been reached (e.g., 8 copies which are a total of 10 hits in the hit column 410 of table 330). A total of all copies of the multiple output values in the table 330 equals a total number of hits in the table 330, such that each hit corresponds to one copy. For example, in table 330, the total number of hits in the hit column 410 is 8 (4+2+1+1) and accordingly, the computation operation circuit 320 was run 8 times to generate 8 copies of the output values in the output value column 405 (i.e., 4 copies/hits of value '010'+2 copies/hits of output value '001'+1 copy/hit of output value '011'+1 copy/hit of output value '100').

The confidence threshold corresponds to a required accuracy of the (answer for the) computation operation on the input. A particular accuracy for a given output value is a number of hits for that given output value divided by a total number of hits in the table 330 (and then multiplied by 100 to obtain the percentage in the percentage column 415). The confidence level is configured to be set to at least one of a high confidence level (e.g., 66%) such as when noise is high, a medium confidence level (e.g., 50%), and/or a low confidence level (e.g., 25%) based on the required accuracy of the computation operation on the input. The medium confidence level is greater than the low confidence level, and the high confidence level is greater than the medium confidence level.

When reliability circuit 115 determines that more than one output value meets the confidence level, the reliability circuit 115 outputs the more than one output values as answers, and/or the output values are processed based on a setting 355 to provide a subset of the answers exceeding the threshold based either on (taking the 2, 3, 4, 5 output vales with the) maximum % in the percentage column 414 or other criteria. For example, the confidence level may be 25%, and assume that values X, Y, Z each have 25% (in percentage column 415) as their respective percentage of hits out of the total number of hits. Accordingly, if the setting 355 indicates all outputs exceeding the threshold should be provided, the reliability circuit 115 then outputs X, Y, and Z as the answers onto the pipe 305. If the setting 355 indicates that only one output is desired, a single output may be chosen by the reliability circuit 115 and provided to the pipe 305.

Figure 6:
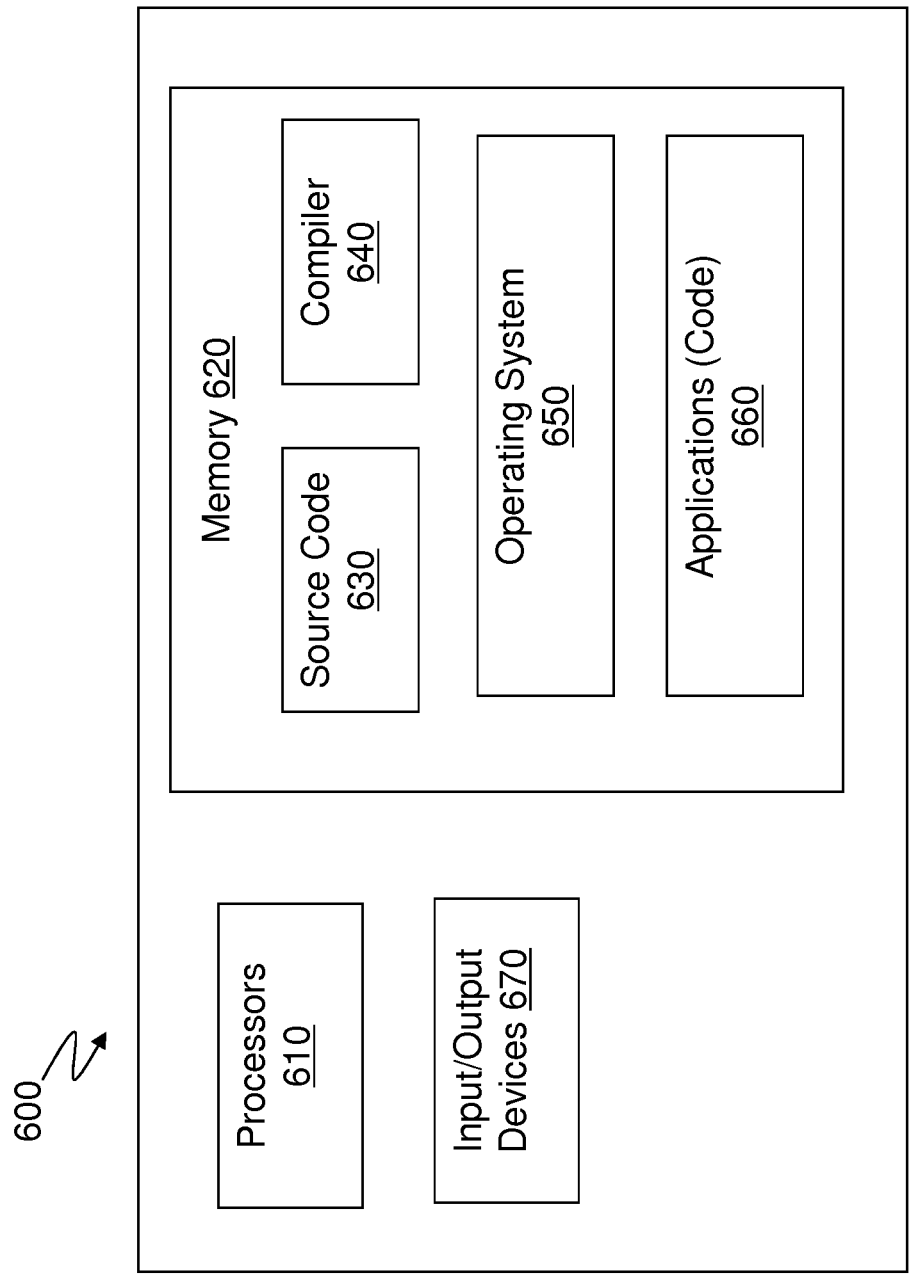
FIG. 6 depicts an example computer having features that may be implemented in, include, and/or be integrated with embodiments discussed herein.

FIG. 6 illustrates an example computer 600 that can implement features discussed herein including, e.g., which includes the various circuits for the reliability circuit 115 and the computer system 100. The computer 600 may be a distributed computer system over more than one computer. Various methods, procedures, modules, flow diagrams, tools, applications, circuits, elements, and techniques discussed herein may also incorporate and/or utilize the capabilities of the computer 600. Indeed, capabilities of the computer 600 may be utilized to implement and execute features of exemplary embodiments discussed herein.

Generally, in terms of hardware architecture, the computer 600 may include one or more processors 610, computer readable storage memory 620, and one or more input and/or output (I/O) devices 670 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 610 is a hardware device for executing software that can be stored in the memory 620. The processor 610 can be virtually any custom made or commercially available processor, a central processing unit (CPU), a data signal processor (DSP), or an auxiliary processor among several processors associated with the computer 600, and the processor 610 may be a semiconductor based microprocessor (in the form of a microchip) or a macroprocessor.

The computer readable memory 620 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Note that the memory 620 can have a distributed architecture, where various components are situated remote from one another, but can be accessed by the processor(s) 610.

The software in the computer readable memory 620 may include one or more separate programs, each of which comprises an ordered listing of executable instructions for implementing logical functions. The software in the memory 620 includes a suitable operating system (O/S) 650, compiler 640, source code 630, and one or more applications 660 of the exemplary embodiments. As illustrated, the application 660 comprises numerous functional components for implementing the features, processes, methods, functions, and operations of the exemplary embodiments.

The operating system 650 may control the execution of other computer programs, and provides scheduling, input-output control, file and data management, memory management, and communication control and related services.

The software application 660 may be a source program, executable program (object code), script, or any other entity comprising a set of instructions to be performed. When a source program, then the program is usually translated via a compiler (such as the compiler 640), assembler, interpreter, or the like, which may or may not be included within the memory 620, so as to operate properly in connection with the O/S 650. Furthermore, the application 660 can be written as (a) an object oriented programming language, which has classes of data and methods, or (b) a procedure programming language, which has routines, subroutines, and/or functions.

The I/O devices 670 may include input devices (or peripherals) such as, for example but not limited to, a mouse, keyboard, scanner, microphone, camera, etc. Furthermore, the I/O devices 650 may also include output devices (or peripherals), for example but not limited to, a printer, display, etc. Finally, the I/O devices 670 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 670 also include components for communicating over various networks, such as the Internet or an intranet. The I/O devices 670 may be connected to and/or communicate with the processor 610 utilizing Bluetooth connections and cables (via, e.g., Universal Serial Bus (USB) ports, serial ports, parallel ports, FireWire, HDMI (High-Definition Multimedia Interface), etc.).

Technical effects and benefits include a solution for monitoring and controlling system reliability, using a reliability circuit. The reliability circuit records multiple outputs of a redundant system and compares the outputs to a desired accuracy threshold to determine the correct output.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Referring now to FIG. 7, a computer program product 700 in accordance with an embodiment that includes a computer readable storage medium 702 and program instructions 704 is generally shown.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer system for implementing system reliability, the system comprising:
    a memory; and
    a processor, communicatively coupled to said memory, the computer system configured to perform a method comprising:
    receiving an input;
    repeating a computation operation on the input to generate multiple output values;
    storing the multiple output values in a table along with a number of hits for each distinct output value in the multiple output values, the number of hits indicating a number of times each distinct output value was generated by the repeating;
    checking, by a reliability circuit, whether the number of hits for any one distinct output value meets a confidence threshold;
    based on meeting the confidence threshold for the number of hits for the any one distinct output value, outputting the any one distinct output value; and
    based on the number of hits for the any one distinct output value not meeting the confidence threshold, continuing to repeat the computation operation on the input until the number of hits for the any one distinct output value meets the confidence threshold.

2. The system of claim 1, wherein a minimum number of copies of the multiple output values are generated by repeatedly executing the computation operation.

3. The system of claim 2, wherein the minimum number of copies required to be generated by the computation operation is set in advance; and
    wherein each time the computation operation is executed, a copy of an output value is generated.

4. The system of claim 2, wherein the minimum number of copies of the multiple output values has to be stored in the table before checking whether the number of hits for the any one output value in the multiple output values meets the confidence threshold.

5. The system of claim 4, wherein when the reliability circuit determines that the minimum number of copies has not been stored in the table, the computation operation continues executing until the minimum number of copies is reached;
    wherein a total of all copies of the multiple output values in the table equals a total number of hits in the table, such that each hit corresponds to one copy.

* * * * *